(12) United States Patent
Miwa et al.

(10) Patent No.: US 6,278,516 B1
(45) Date of Patent: Aug. 21, 2001

(54) PROJECTION EXPOSURE APPARATUS AND METHOD OF PRODUCING A DEVICE USING A PROJECTION EXPOSURE APPARATUS

(75) Inventors: Yoshinori Miwa, Utsunomiya; Tetsumi Yamana, Yaita, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/209,493

(22) Filed: Dec. 11, 1998

(30) Foreign Application Priority Data

Dec. 19, 1997 (JP) .................................................. 9-350970

(51) Int. Cl.[7] ........................... G03B 27/54; G03B 27/42; G03B 27/60
(52) U.S. Cl. ................................... 355/67; 355/53; 355/73
(58) Field of Search ................................... 355/53, 71, 73, 355/76, 67; 73/866.5; 49/371, 475.1

(56) References Cited

U.S. PATENT DOCUMENTS

| | | | |
|---|---|---|---|
| 3,819,269 | * 6/1974 | Duvall et al. | 356/36 |
| 3,857,334 | * 12/1974 | Arp | 100/53 |
| 4,690,528 | * 9/1987 | Tanimoto et al. | 353/101 |
| 4,900,932 | * 2/1990 | Schafer et al. | 250/397 |
| 5,097,136 | * 3/1992 | Meyer et al. | 250/492.1 |
| 5,559,584 | * 9/1996 | Miyaji et al. | 355/73 |
| 5,582,696 | * 12/1996 | Sheehan | 204/403 |
| 5,602,683 | * 2/1997 | Straaijer et al. | 359/811 |
| 5,948,166 | * 9/1999 | David et al. | 118/718 |
| 6,000,290 | * 12/1999 | Benton et al. | 73/866.5 |

FOREIGN PATENT DOCUMENTS

| | | |
|---|---|---|
| 2-210813 | 8/1990 | (JP) . |
| 4-128702 | 4/1992 | (JP) . |
| 4-139453 | 5/1992 | (JP) . |

* cited by examiner

*Primary Examiner*—Russell Adams
*Assistant Examiner*—Rodney Fuller
(74) *Attorney, Agent, or Firm*—Fitzpatrick, Cella, Harper & Scinto

(57) ABSTRACT

A projection exposure apparatus capable of detecting projection exposure conditions in the middle of a laser beam irradiation path. The apparatus includes a laser source for generating a laser beam, an illumination optical system for illuminating a reticle with the laser beam, a projection optical unit for projecting a pattern of the reticle onto a wafer, a light shielding member in which the path of the laser beam emitted by the laser source is enclosed and in which an inert gas is supplied, a removable enclosure for enclosing the light shielding member, an insertion slot formed in the light shielding member so that a detector for detecting a physical or chemical characteristic in the vicinity of the laser beam path may be inserted into the insertion slot, and a light shielding lid provided on the light shielding member. The light shielding lid can be opened and closed when the detector is inserted or removed. When the detector is inserted, the lid is pushed into its open position, and when the detector is removed, the lid moves into a closed position and rests in the closed position in which the insertion slot is closed with the lid.

30 Claims, 11 Drawing Sheets

PROJECTION EXPOSURE APPARATUS AND METHOD OF PRODUCING A DEVICE USING A PROJECTION EXPOSURE APPARATUS

BACKGROUND OF THE INVENTION

The present invention relates to a projection exposure apparatus used, in a process of producing a semiconductor device such as an IC or LSI, to project a laser beam onto a substrate so as to form thereon a reduced image of a circuit pattern of a reticle (also called a mask).

In recent years, great advances have been made in the technology of producing semiconductor devices. With great advances in general semiconductor production technology, great advances have also been made in the microlithography technology. With the most advanced photolithography technology, it is possible to obtain high resolution in the sub-micron range. One possible method to further improve the resolution is to increase the NA (numerical aperture) of an optical system using exposure light with a fixed wavelength. Another method is to reduce the wavelength of the exposure light.

Various techniques based on the latter method have been proposed to improve the resolution using ultraviolet light with a small wavelength such as an excimer laser beam. The excimer laser apparatus, unlike conventional light sources such as a super-high pressure mercury lamp for emitting i-line light, is very large in size and weight, and thus it is installed separately from the main part of an exposure apparatus. Furthermore, in order to minimize the apparatus installation space in a clean room and also for the reason of safety, the excimer laser generator is installed, in most cases, in a room separated from a room in which the main part of the exposure apparatus is installed. For example, the excimer laser apparatus is installed in a room on a floor below the clean room or in a room which is on the same floor as the clean room but which is isolated from any other rooms.

The laser beam generated by the laser apparatus is transmitted to the exposure apparatus directly or through a plurality of light deflection elements such as mirrors, or through another type of optical path properly selected depending on the installation conditions. In any case, it is required that the optical path between the laser apparatus and the main part of the exposure apparatus should be tightly shielded. As is well known, a highly reliable safety system is required to ensure that no strong ultraviolet radiation such as an excimer laser beam leaks outward from the optical path. It is desirable that the inside of the optical path be purged with an inert gas such as nitrogen so that the optical elements in the optical path are prevented from being degraded. That is, it is required that the projection exposure apparatus using a laser beam should meet both requirements described above.

In view of the above, it is a general object of the present invention to solve the above problems. More specifically, it is an object of the invention to provide a technique which makes it possible to perform maintenance of the laser beam path of a projection exposure apparatus while ensuring complete safety, without causing degradation of optical elements, and at low cost.

SUMMARY OF THE INVENTION

According to a first aspect of the present invention, to achieve the above objects, there is provided a projection exposure apparatus capable of detecting projection exposure conditions in the middle of a laser beam irradiation path, the projection exposure apparatus comprising: a laser source for generating a laser beam; an illumination optical unit for illuminating a reticle with the laser beam; a projection optical unit for projecting a pattern of the reticle onto a wafer; a light shielding member in which the path of the laser beam emitted by the laser source is enclosed and in which an inert gas is supplied; a removable enclosure for enclosing the light shielding member; an insertion slot formed in the light shielding member so that a detector for detecting a physical or chemical characteristic in the vicinity of the laser beam path may be inserted into the insertion slot; and a light shielding lid provided on the light shielding member, the light shielding lid being capable of being opened and closed when the detector is inserted or removed, wherein when the detector is inserted, the light shielding lid is pushed into its open position whereas when the detector is removed, the light shielding lid moves into a closed position and rests in the closed position in which the insertion slot is closed with the light shielding lid.

According to a second aspect of the present invention, there is provided a projection exposure apparatus capable of detecting projection exposure conditions in the middle of a laser beam irradiation path, the projection exposure apparatus comprising: a laser source for generating a laser beam; an illumination optical unit for illuminating a reticle with the laser beam; a projection optical unit for projecting a pattern of the reticle onto a wafer; a light shielding member in which the path of the laser beam emitted by the laser source is enclosed and in which an inert gas is supplied; a removable enclosure for enclosing the light shielding member; an insertion slot formed in the light shielding member so that a detector for detecting a physical or chemical characteristic in the vicinity of the laser beam path may be inserted into the insertion slot; and a tight sealing lid provided on the light shielding member, the tight sealing lid being capable of being opened and closed when the detector is inserted or removed wherein when the detector is inserted, the tight sealing lid comes into an open position in which the tight sealing lid prevents the enclosure from being placed in the normal position.

According to a third aspect of the present invention, there is provided a projection exposure apparatus capable of detecting projection exposure conditions in the middle of a laser beam irradiation path, the projection exposure apparatus comprising: a laser source for generating a laser beam; an illumination optical unit for illuminating a reticle with the laser beam; a projection optical unit for projecting a pattern of the reticle onto a wafer; a light shielding member in which the path of the laser beam emitted by the laser source is enclosed and in which an inert gas is supplied; a removable enclosure for enclosing the light shielding member; an insertion slot formed in the light shielding member so that a detector for detecting a physical or chemical characteristic in the vicinity of the laser beam path may be inserted into the insertion slot; and a lid disposed on the insertion slot and capable of being opened and closed when the detector is attached or removed.

According to a fourth aspect of the invention, there is provided a method of producing a semiconductor device, including a projection exposure step using a projection exposure apparatus according to the first aspect described above.

According to a fifth aspect of the invention, there is provided a method of producing a semiconductor device, including a projection exposure step using a projection exposure apparatus according to the second aspect described above.

According to a sixth aspect of the invention, there is provided a method of producing a semiconductor device, including a projection exposure step using a projection exposure apparatus according to the third aspect described above.

In the projection exposure apparatus according to the above-described second aspect of the invention, the projection exposure apparatus may further include a light shielding lid provided on the light shielding member, the light shielding lid being capable of being opened and closed when the detector is inserted or removed, wherein when the detector is inserted, the light shielding lid is pushed into its open position whereas when the detector is removed, the light shielding lid moves into a closed position and rests in the closed position in which the insertion slot is closed with the light shielding lid.

In the projection exposure apparatus according to the above-described first aspect of the invention, the light shielding lid may include a mechanism whereby when the detector is inserted, the light shielding lid is opened to the inner side of the light shielding member whereas when the detector is removed, the light shielding lid returns by means of its own weight into the closed position and rests in the closed position in which the insertion slot is closed with the light shielding lid.

Alternatively, in the projection exposure apparatus according to the above-described first aspect of the invention, said light shielding lid may include a mechanism whereby when the detector is inserted, the light shielding lid is opened to the inner side of the light shielding member whereas when the detector is removed, the light shielding lid is moved by means of a spring force into the closed position and rests in the closed position in which the insertion slot is closed with the light shielding lid.

In the projection exposure apparatus according to the above-described second aspect of the invention, the tight sealing lid may include a rotation shaft extending in a direction substantially perpendicular to the direction in which the detector is inserted, and the tight sealing lid may further include a mechanism whereby the tight sealing lid moves by means of its own weight to the outside of the light shielding member and rests in that position.

Alternatively, in the projection exposure apparatus according to the above-described second aspect of the invention, the tight sealing lid may include a mechanism whereby the tight sealing lid moves into a horizontal position by means of its own weight in a plane substantially perpendicular to the direction in which the detector is inserted and rests in an open position.

In the projection exposure apparatus according to the above-described second aspect of the invention, the tight sealing lid may further include a mechanism whereby the tight sealing lid moves by means of a spring force into an open position and rests in that position.

In the projection exposure apparatus according to the above-described first aspect of the invention, there may be provided a sealing member disposed between the tight sealing lid and the light shielding member whereby the sealing tightness is enhanced.

In the projection exposure apparatus according to the above-described second aspect of the invention, there may be provided a sealing member disposed between the tight sealing lid and the light shielding member whereby the sealing tightness is enhanced.

In the projection exposure apparatus according to the above-described first aspect of the invention, the physical characteristic may be the intensity of the laser beam and the chemical characteristic may be the concentration of the inert gas.

In the projection exposure apparatus according to the above-described second aspect of the invention, the physical characteristic may be the intensity of the laser beam and the chemical characteristic may be the concentration of the inert gas.

In the projection exposure apparatus according to the above-described third aspect of the invention, the physical characteristic may be the intensity of the laser beam and the chemical characteristic may be the concentration of the inert gas.

In the projection exposure apparatus according to the above-described first aspect of the invention, the projection exposure apparatus may further include an interlock mechanism for detecting the presence/removal of the enclosure and allowing a laser beam to be generated according to the detection result.

In the projection exposure apparatus according to the above-described second aspect of the invention, the projection exposure apparatus may further include an interlock mechanism for detecting the presence/removal of the enclosure and allowing a laser beam to be generated according to the detection result.

In the projection exposure apparatus according to the above-described third aspect of the invention, the projection exposure apparatus may further include an interlock mechanism for detecting the presence/removal of the enclosure and allowing a laser beam to be generated according to the detection result.

BRIEF DESCRIPTION OF THE DRAWING

The accompanying drawings, which are incorporated in and constitute a part of the specification, illustrate embodiments of the invention, and together with the description, serve to explain the principles of the invention.

DETAILED DESCRIPTION OF THE INVENTION

Preferred embodiments of the present invention will be described in detail in accordance with the accompanying drawings.

Figure 1:
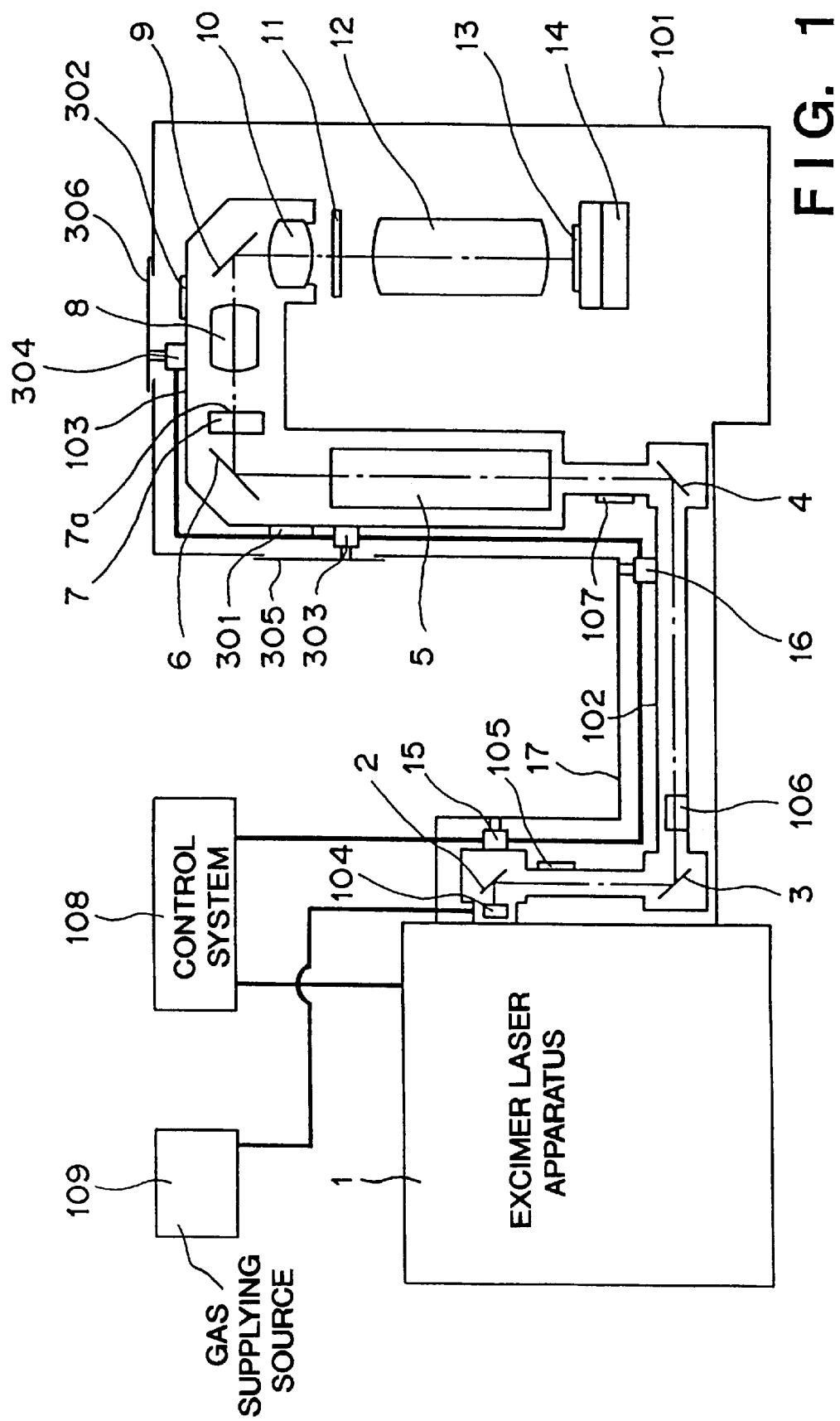
FIG. 1 is a schematic diagram illustrating the construction of an embodiment of a projection exposure apparatus according to the present invention.

FIG. 1 is a schematic diagram illustrating the construction of a first embodiment of a projection exposure apparatus according to the present invention. Reference numeral 1 denotes an excimer laser apparatus serving as a laser source such as a KrF excimer laser apparatus for generating a laser beam with a wavelength of about 248 nm, an ArF excimer laser apparatus for generating a laser beam with a wavelength of about 193 nm, or an F2 laser apparatus for generating a laser beam with a wavelength of about 157 nm.

The laser beam emitted from the laser beam source 1 is reflected by mirrors 2 and 3 and directed to the main part 101 of the exposure apparatus. The optical path between the output part of the excimer laser apparatus 1 and the end (lens 10) of an illumination optical system of the main part 101 of the exposure apparatus is enclosed in a light shielding member 102.

The laser beam is incident on an illumination optical system 103 provided in the main part 101 of the exposure apparatus. The laser beam is reflected by a mirror 4 in the illumination optical system 103 and directed to a shaping optical system 5 for shaping the laser beam into a predetermined shape. The laser beam is then incident on an optical integrator 7 via a mirror 6. The optical integrator 7 includes a plurality of micro lenses arranged in a two-dimensional fashion. A secondary light source is formed near the emerging surface 7a of the optical integrator 7. The laser beam emerging from the emerging surface 7a is then projected, via a lens system 8, a mirror 9, and a lens system 10, onto a reticle 11 held on a reticle stage (not shown) so that the pattern surface of the reticle 11 is uniformly illuminated with the laser beam. The pattern formed on the reticle 11 is projected via a projection optical system 12 onto a surface of a wafer 13 placed on a stage 14 so that a reduced image of the pattern is formed thereon.

The light shielding member 102 has insertion slots 104, 105, 106, and 107 through which a detector is inserted. The light shielding member 102 also has similar insertion slots 301 and 302. These insertion slots will be described in detail later. Reference numerals 15, 16, 303, and 304 denote interlock switches. The light shielding member 102 is enclosed with a removable cover 17. There are also provided covers 305 and 306. The presence/removal of these covers is detected by the interlock switches 15, 16, 303, and 304, and the detection results are transmitted to a control system 108. The control system 108 is also connected to the laser apparatus 1 so that a laser beam cannot be generated when removal of any cover is detected.

An inert gas such as nitrogen is supplied from a gas supplying source 109 into the light shielding member 102 and exhausted via an exhaust outlet (not shown) so that the optical path is entirely purged with the inert gas. As disclosed, for example, in Japanese Patents Laid-Open Nos. 4-128702, 4-139453, and 2-210813, if optical elements are illuminated with light for a long time, aluminum ammonium sulfate $(NH_4)_2SO_4$ or silicon dioxide $SiO_2$ is deposited on the surface of the optical elements. This causes great degradation in optical characteristics. Such deposition results from a chemical reaction which occurs when ammonia $NH_3$, sulfurous acid $SO_2$, or a Si compound in the ambient is irradiated with ultraviolet light.

The degradation of the optical elements is prevented by purging the optical path of the laser beam with an inert gas such as nitrogen.

Figure 2:
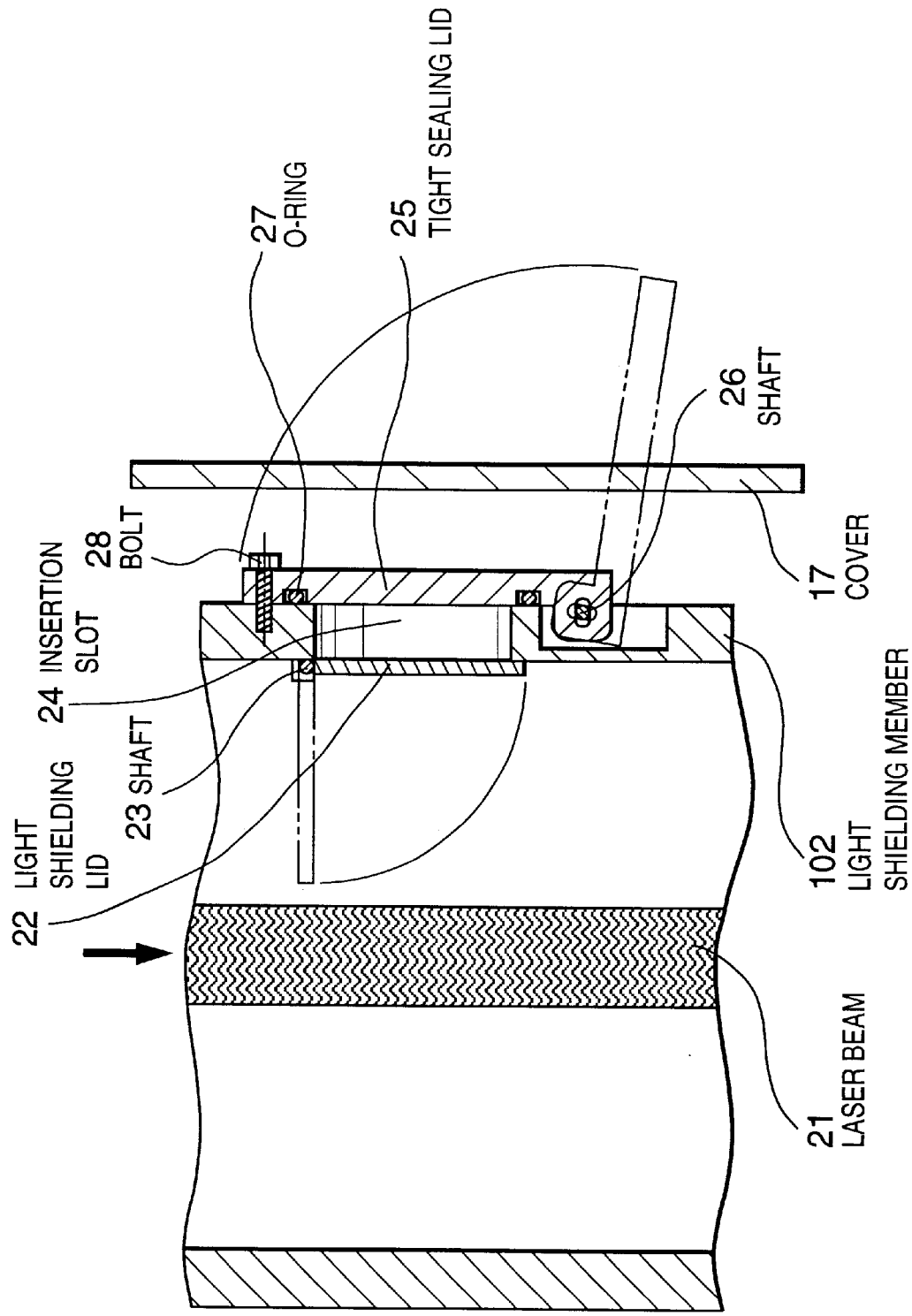
FIG. 2 is a partial schematic diagram illustrating the details of the insertion slot shown in FIG. 1.

FIG. 2 illustrates a part including one of the detector insertion slots shown in FIG. 1. In FIG. 2, reference numeral 21 denotes a laser beam which travels in a direction denoted by an arrow in FIG. 2. Reference numeral 102 denotes the above-described light shielding member enclosing the optical path. Reference numeral 17 denotes the enclosure described above. Reference numeral 22 denotes a light shielding lid with which the light shielding member 24 is closed. If the lid 22 is pushed from the outside, it pivots about a shaft 23 toward the optical path side. When there is no external force, the light shielding lid 22 moves down by means of its own weight and rests in a position in which the insertion slot 24 is closed with the lid 22. Reference numeral 25 denotes a tight sealing lid attached to the light shielding member 102 with bolts 28 at peripheral locations.

An O-ring 27 is embedded in the tight sealing lid 25 so as to enhance the sealing tightness between the tight sealing lid 25 and the light shielding member 102 when the tight sealing lid 25 is in a closed state. If the bolts 28 are removed, the tight sealing lid 25 pivots outward by 90° or greater about a shaft 26 by means of its own weight and rests in a horizontal position (represented by a broken line in FIG. 2). When the tight sealing lid 25 is in the horizontal position, if one tries to place the enclosure in its normal position, the tight sealing lid 25 physically prevents the enclosure from being placed in the normal position. There is a proper clearance between the shaft 26 and the shaft hole of the tight sealing lid 25 so that the tight sealing lid 25 can be tightly attached by fastening the bolts 28 without having interference from the shaft 26.

Figure 3:
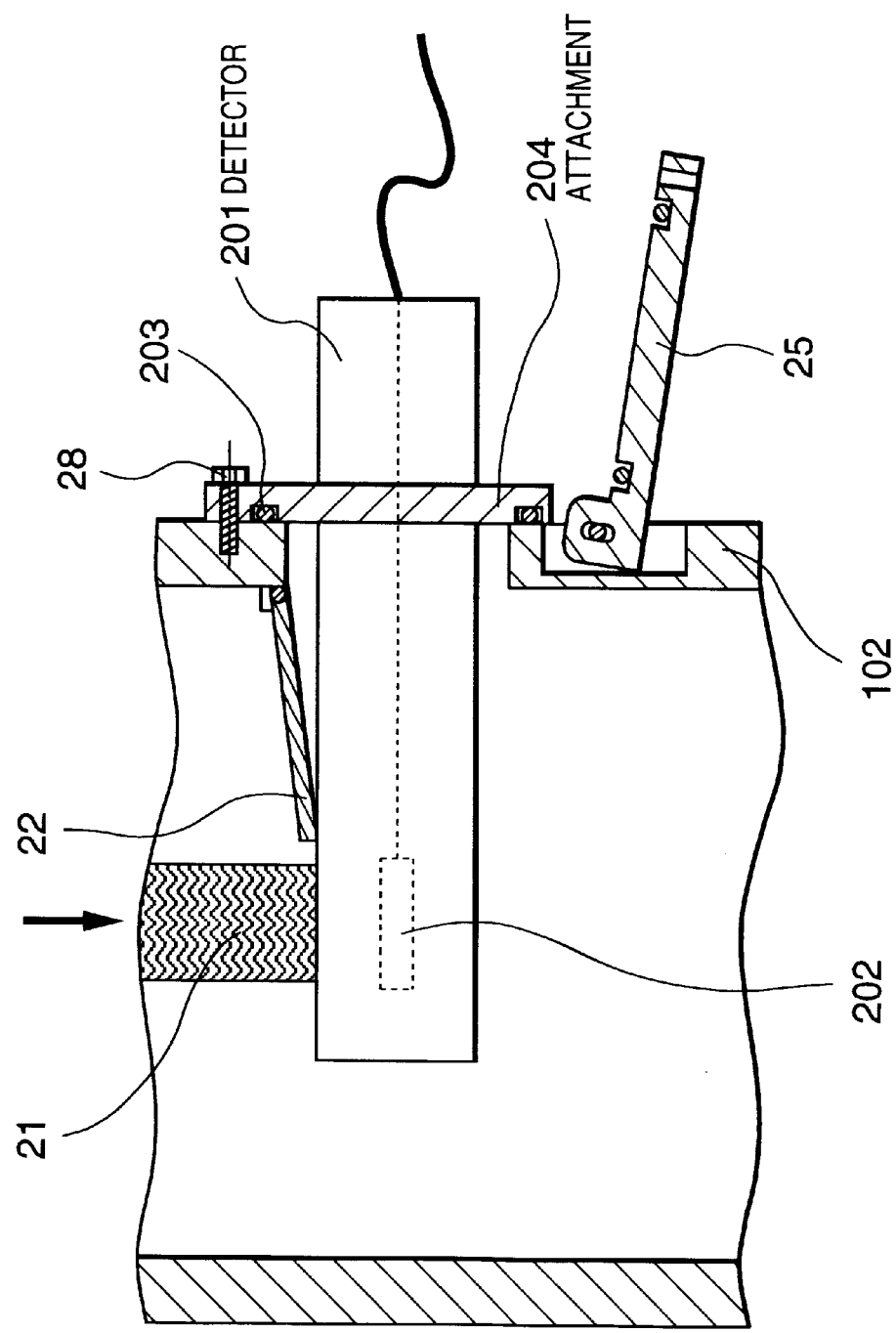
FIG. 3 is a schematic diagram illustrating a state in which a detector is attached through the insertion slot.

To perform measurement, a detector 201 is inserted into the insertion slot as shown in FIG. 3. The detector 201 has an attachment 204 formed in an integral fashion. Bolt holes are formed in the attachment 204 at the same locations as those of the bolt holes formed in the tight sealing lid 25 so that the detector 201 can be attached using the same plurality of bolts 28 used to fasten the tight sealing lid 25. Furthermore, the attachment 204 of the detector has an O-ring 203 similar to the O-ring 27 shown in FIG. 2 thereby ensuring the sealing tightness with respect to the light shielding member 102. As can be seen from FIG. 3, when the detector 201 is attached, the enclosure is removed from the outside of the light shielding member 102. In this state, the tight sealing lid 25 in the open state physically prevents the enclosure from being placed into its normal position, and generation of a laser beam is inhibited.

The detector 201 includes a photo detection unit 202 including a sensor element, which is located in the optical path so that the intensity of the laser beam is detected and the detection result is output. The optical axis of the laser beam shifts due to long-term deformation of the floor or the building construction where the laser apparatus is installed. Such a shift of the optical axis can cause the optical system to become incapable of working in a proper manner. To avoid such a problem, the shift of the optical axis is regularly measured, and the detected shift is corrected. The detector 202 is not limited to the type which detects a physical characteristic (intensity of light), but a detector for detecting a chemical characteristic (inert gas concentration) in the vicinity of the optical path or other types of detectors may also be employed. When there are various types of detectors, if their attachment is formed according to the same specifications, any detector may be selected as required and attached into the insertion slot. In the present embodiment, the optical path is enclosed with the light shielding member and the light shielding member is further enclosed with the enclosure wherein there are provided interlock switches so that a laser beam is allowed to be generated only when the interlock switches indicate that the enclosure is in its normal position. Furthermore, the safety system also includes a mechanism which prevents the interlock from being accidentally operated when the enclosure is removed for maintenance or for any other reason. Another feature of the present embodiment is that the light shielding lid 22 is automatically closed when the detector is removed. When the detector is attached, the tight sealing lid 25 is opened and the tight sealing lid 25 in the open state interferes with the enclosure so as to prevent the enclosure from being placed in the normal position. If these mechanisms were not provided, an inert gas used as a purging gas would leak when an operator placed the enclosure into the normal position without closing the lid after completion of a maintenance operation, and the internal optical elements would be degraded as a result of the leakage of the inert gas. Furthermore, if the above safety mechanism were not provided, a laser beam could leak outward when an operator released by mistake the interlock without attaching a detector after completion of a maintenance operation. The safety mechanism of the present embodiment prevents such problems.

Modifications of the Insertion Slot

Figure 4:
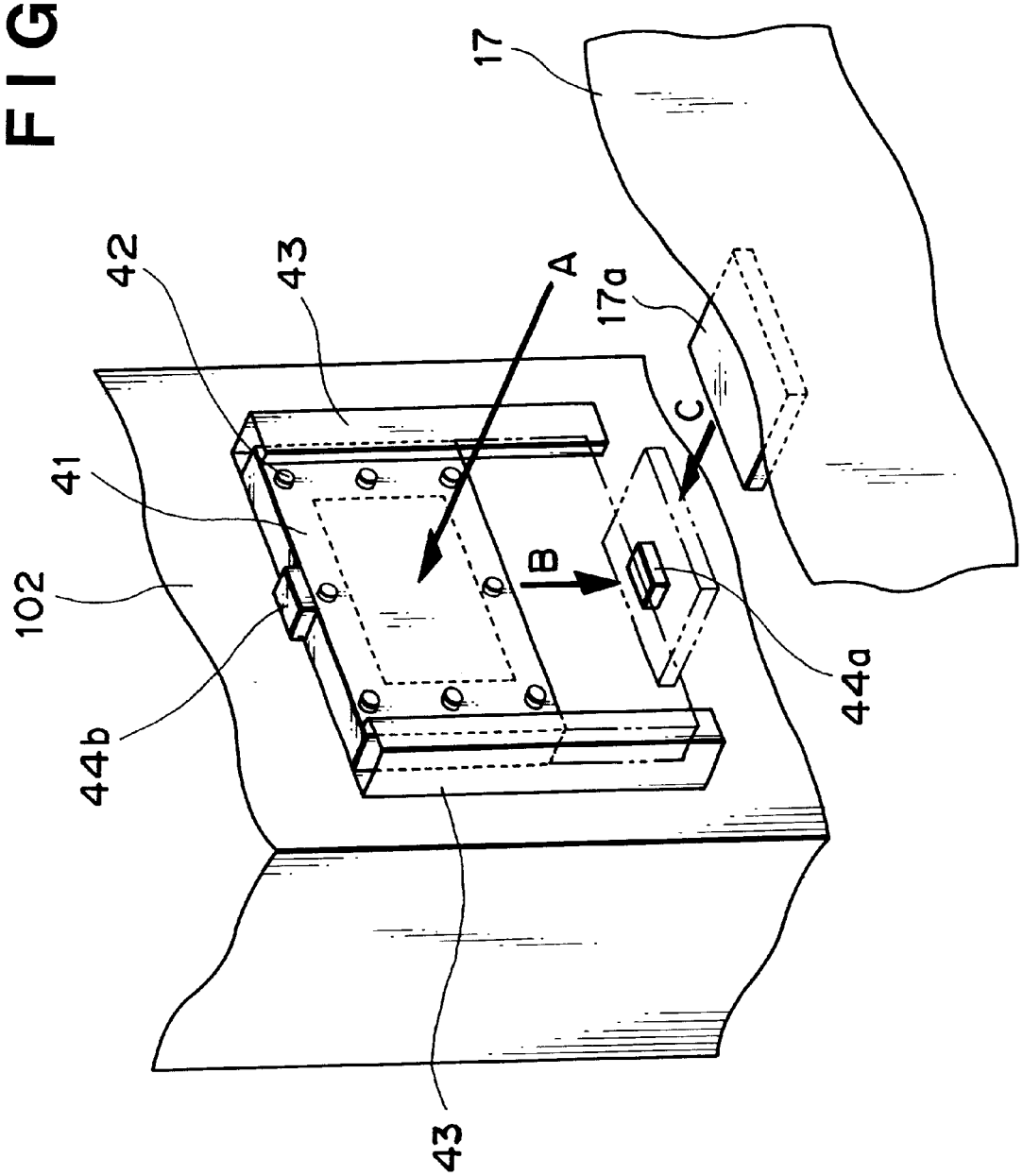
FIG. 4 is a schematic diagram illustrating a modification of the insertion slot.

FIG. 4 illustrates a modification of the insertion slot. A tight sealing lid 41 is firmly connected to a light shielding member 102 with a plurality of bolts 42. An O-ring (not shown) is disposed between the tight sealing lid 41 and the light shielding member 102 to ensure good sealing tightness. An insertion slot via which a detector (not shown) is inserted in a direction denoted by an arrow A is closed with the tight sealing lid 41. If the bolts 42 are removed, the tight sealing lid 41 moves downward, that is, in a direction denoted by an arrow B, by means of its own weight along two guides 43 until it stops at a stopper 44a. The enclosure 17 has a projection 17a so that when the tight sealing lid 41 is in the lowered position, the projection 17a prevents the enclosure 17 from being placed in the normal position. On the other hand, when the tight sealing lid 41 is in a closing position as shown in FIG. 4, the enclosure 17 can be placed in the normal position without having interference from the projection 17a. Although not shown in FIG. 4, a light shielding lid similar to that shown in FIG. 2 is provided on the inner side of insertion slot.

Figure 5:
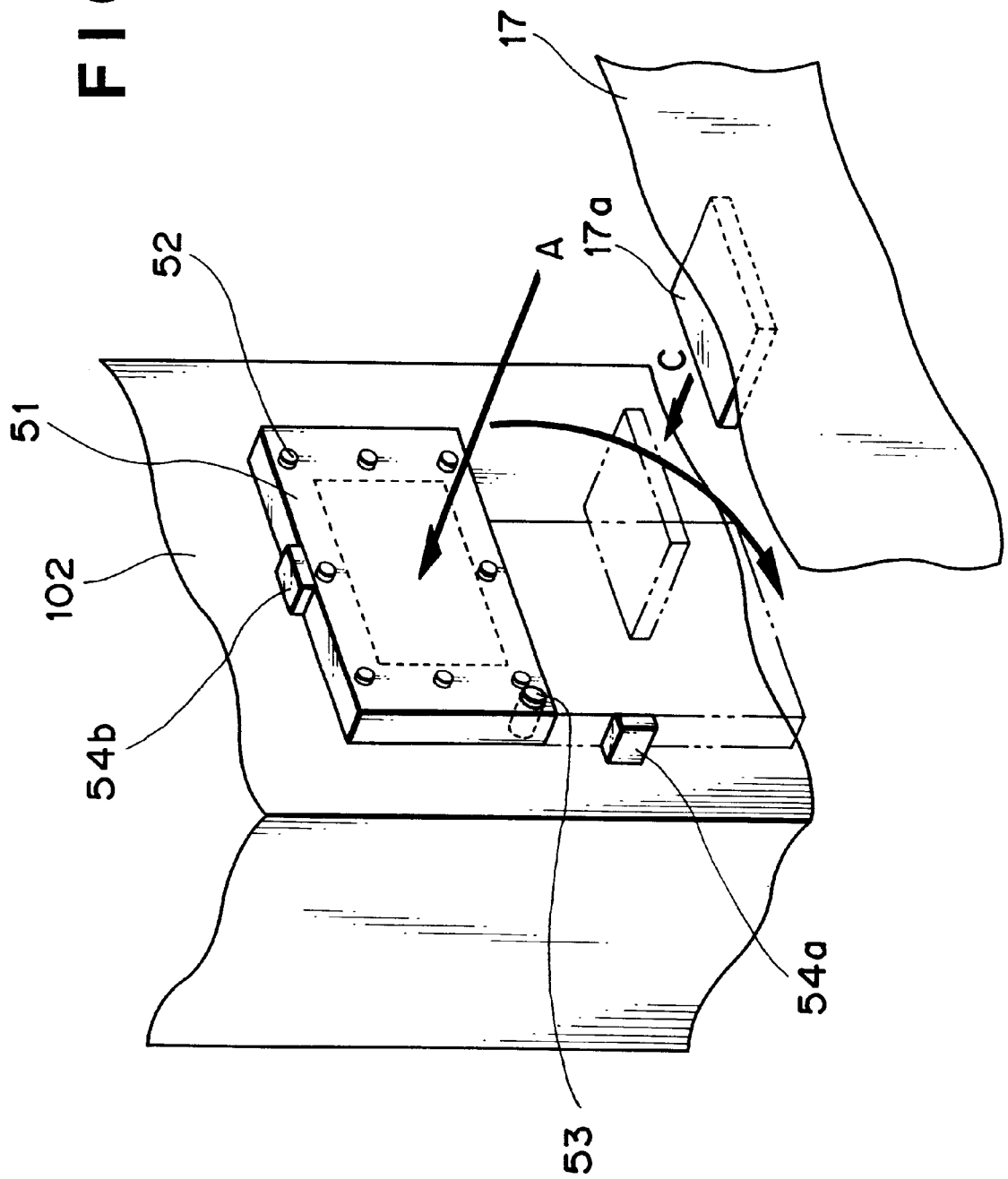
FIG. 5 is a schematic diagram illustrating another modification of the insertion slot.

FIG. 5 illustrates another modification of the insertion slot. A tight sealing lid 51 is firmly connected to a light shielding member 102 with a plurality of bolts 52. An O-ring (not shown) is disposed between the tight sealing lid 51 and the light shielding member 102 to ensure good sealing tightness. An insertion slot into which a detector (not shown) is inserted in a direction denoted by an arrow A is closed with the tight sealing lid 51. If bolts 52 are removed, the tight sealing lid 51 pivots about a shaft 53 in a downward direction by means of its own weight and stops at a stopper 54a. The enclosure 17 has a projection 17a so that when the tight sealing lid 51 is in the lowered position, the projection 17a prevents the enclosure 17 from being placed in the normal position. On the other hand, when the tight sealing lid 51 is in a closing position as shown in FIG. 4, the enclosure 17 can be placed in the normal position without having interference from the projection 17a. Although not shown in FIG. 4, a light shielding lid similar to that shown in FIG. 2 is provided on the inner side of insertion slot.

Figure 6:
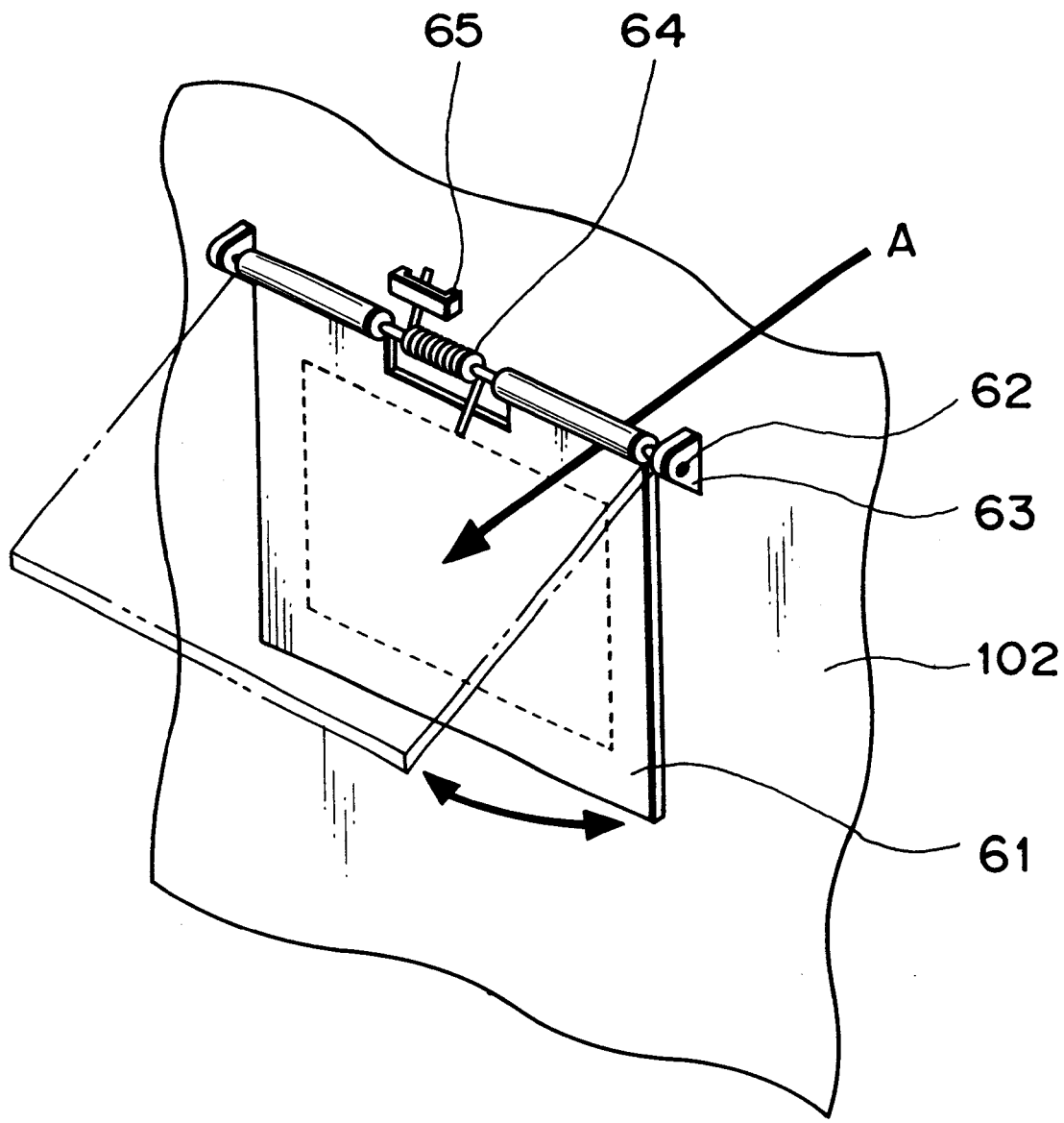
FIG. 6 is a schematic diagram illustrating still another modification of the insertion slot.

FIG. 6 illustrates still another modification of the insertion slot. A torque is applied by a helical torsion coil spring 64 to a light shielding lid 61 so that the light shielding lid 61 is rotationally urged about a shaft 62 supported between two brackets 63 in a direction toward a closed position. If a detector (not shown) is inserted in a direction denoted by an arrow A, the light shielding lid 61 is pushed and opened. Reference numeral 65 denotes a spring peg for fixing one end of a spring 64. The application of the spring force makes it possible to achieve the purpose of the light shielding lid 61 in whatever position the light shielding lid 61 is with respect to the direction of gravitation.

Figure 7:
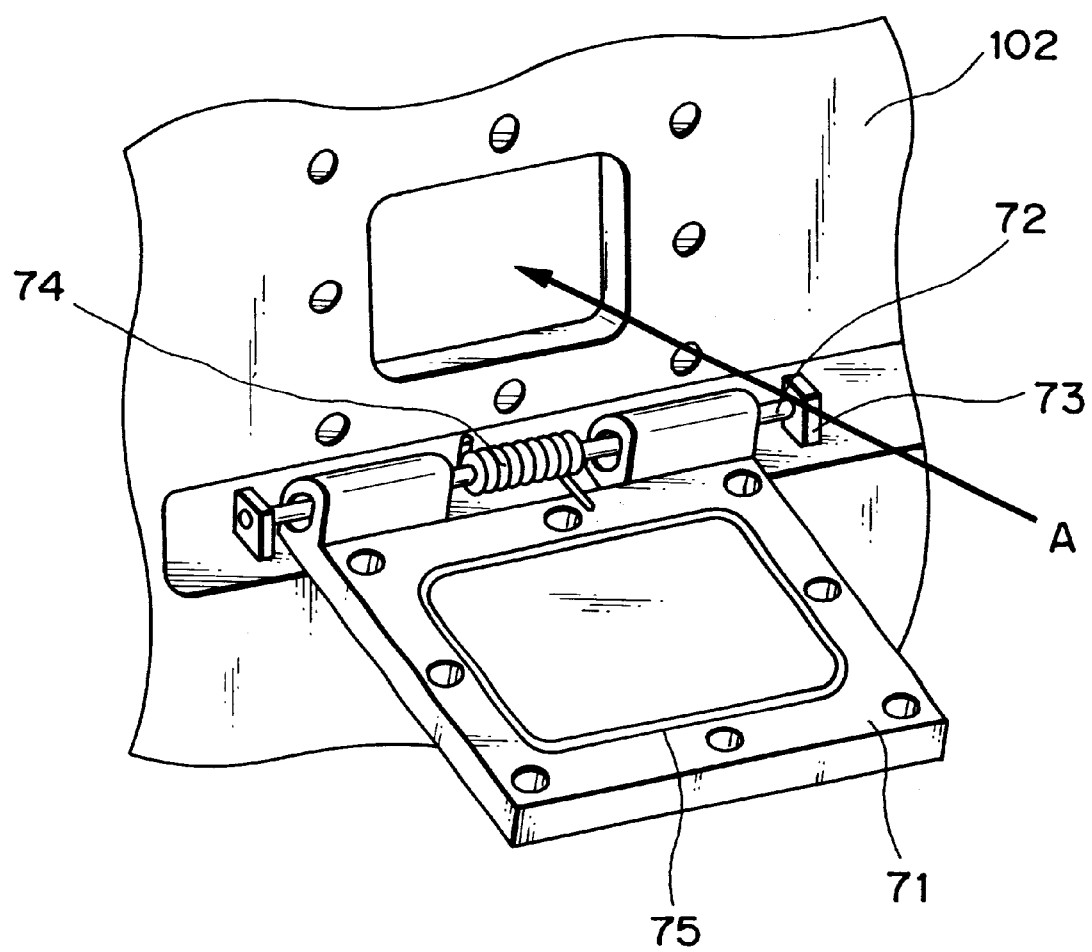
FIG. 7 is a schematic diagram illustrating still another modification of the insertion slot.

FIG. 7 illustrates still another modification of the insertion slot. In this case, a torque is applied by a helical torsion coil spring 64 to a tight sealing lid 71 so that the light shielding lid 61 is rotationally urged about a shaft 72 supported between two brackets 73 in a direction toward an open position. The tight sealing lid 71 may be fixed to a light shielding member 102 with bolts (not shown). An O-ring 75 is used to ensure the sealing tightness. As in the first embodiment, there is a proper clearance between the shaft 72 and the shaft hole of the tight sealing lid 71 so that the tight sealing lid 71 can be tightly attached by fastening the bolts (not shown) without having interference from the shaft 72. The application of the spring force makes it possible to achieve the purpose of the tight sealing lid 71 in whatever position the tight sealing lid 71 is located with respect to the direction of gravitation.

Figure 8:
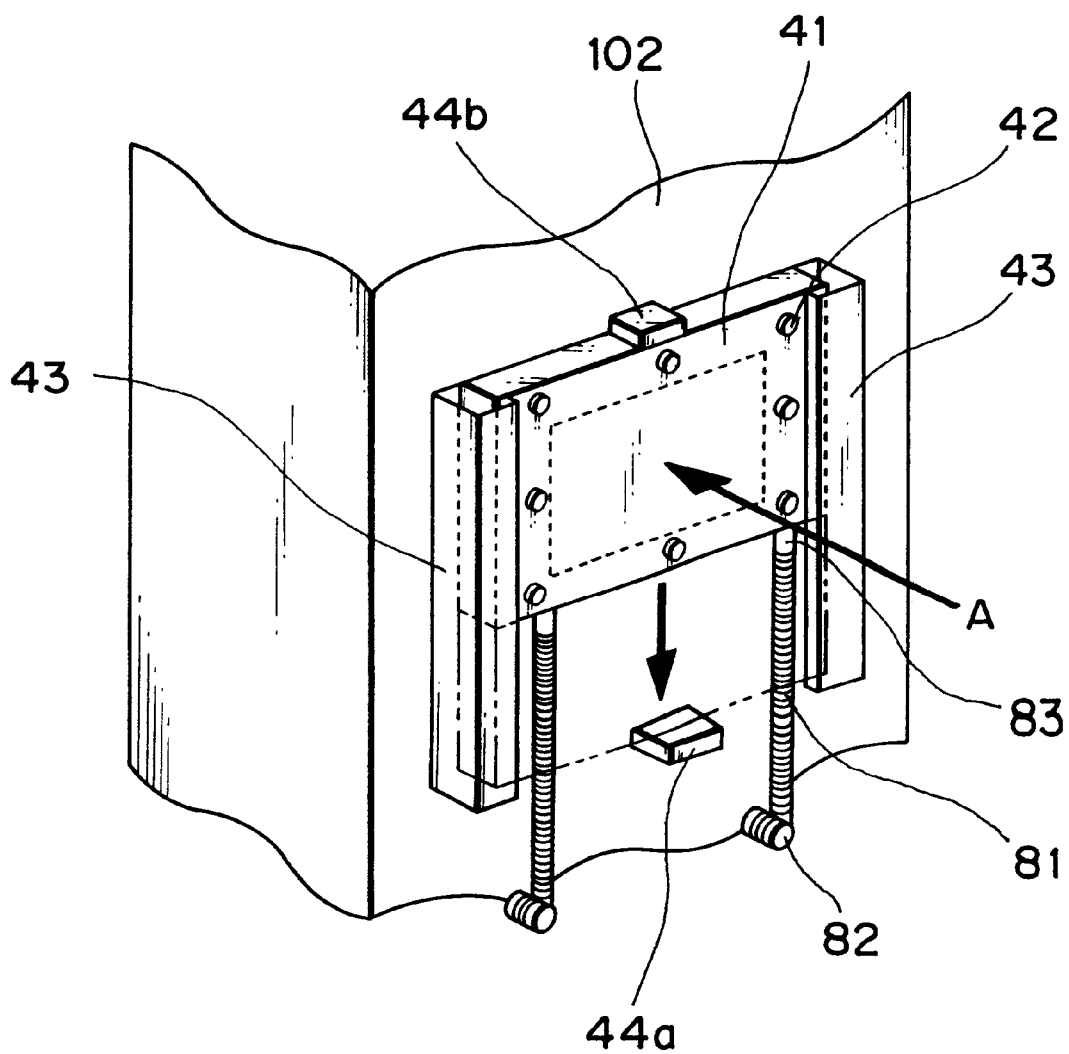
FIG. 8 is a schematic diagram illustrating still another modification of the insertion slot.

FIG. 8 illustrates still another modification of the insertion slot. In this example, there are provided springs added to the structure shown in FIG. 4. In this structure, a detector (not shown) is inserted in a direction denoted by an arrow A. A tight sealing lid 41 is fixed to a light shielding member 102 with a plurality of bolts 42. If the bolts 42 are removed, the tight sealing lid 41 is pulled by extension helical springs 81, ends of which are fixed to spring pegs 82 and 83, and moves downward along two guides 43. The tight sealing lid 41 is stopped by a stopper 44a at an open position. The application of the spring force makes it possible to achieve the purpose of the tight sealing lid 41 in whatever position the tight sealing lid 41 is located with respect to the direction of gravitation.

Figure 9:
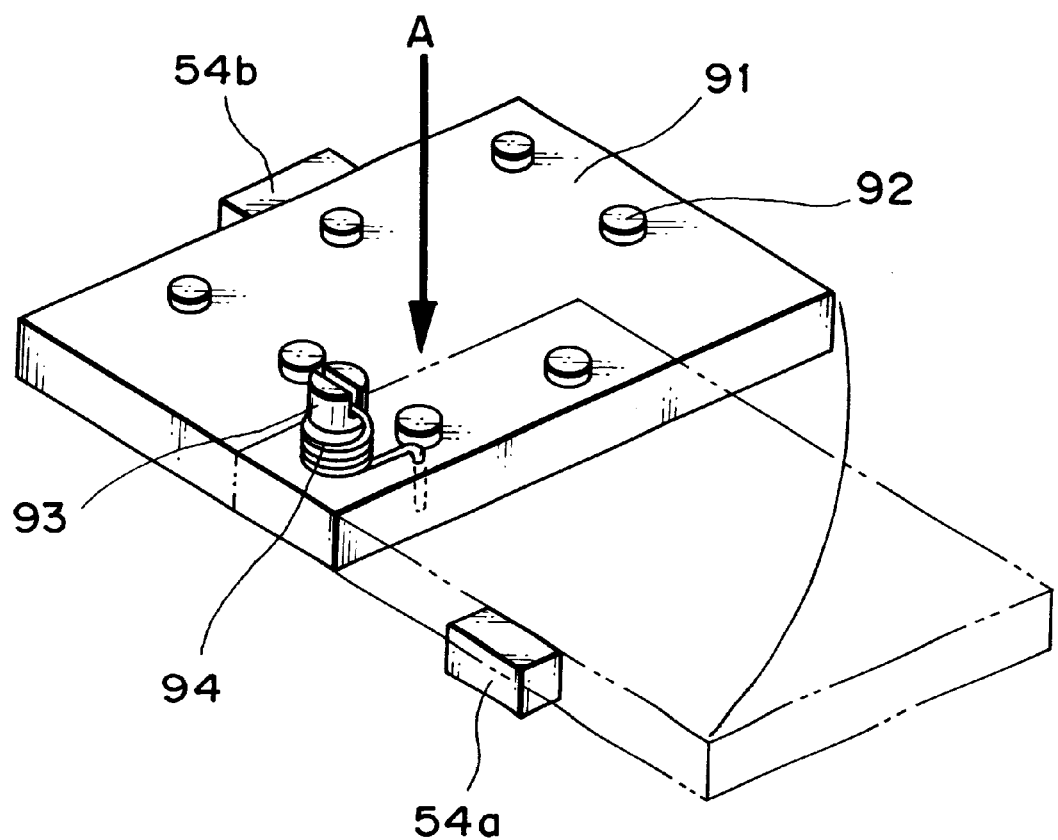
FIG. 9 is a schematic diagram illustrating still another modification of the insertion slot.

FIG. 9 illustrates still another modification of the insertion slot. In this example, there are provided springs added to the structure shown in FIG. 5. In this case, a detector (not shown) is inserted in a direction denoted by an arrow A. A tight sealing lid 91 is fixed to a light shielding member (not shown) with a plurality of bolts 92. If the bolts 92 are removed, the tight sealing lid 91 is moved by a helical spring 94 rotationally about a shaft 93 until the tight sealing lid 91 is stopped by a stopper 54a at an open position. The application of the spring force makes it possible to achieve the purpose of the tight sealing lid in whatever position the tight sealing lid is located with respect to the direction of gravitation.

Although in the embodiments described above, an O-ring is disposed between a tight sealing lid and a light shielding member, the invention is not limited to that. The O-ring may be replaced with any other members capable of enhancing the sealing tightness. The O-ring may be attached to either the tight sealing lid or the light sealing member.

Furthermore, although in the embodiments described above, bolts are used to fasten the tight sealing lid to the light sealing member, other proper means may also be employed.

Still furthermore, although in the embodiments described above, a helical torsion coil spring or an extension helical spring is used to urge the light shielding lid or the tight sealing lid, the invention is not limited to those types of springs. Other types of springs such as a flat spring or a herical compression spring may also be employed.

As for the insertion slots, a proper number of insertion slots may be provided at locations selected depending on the type of the laser beam path and the arrangement of optical elements.

In the projection exposure apparatus according to the invention, as described above, maintenance of the laser beam path of the projection exposure apparatus can be performed while ensuring complete safety, without causing degradation of optical elements, and at low cost.

The Application of the Projection Exposure Apparatus to Production of Devices

Figure 10:
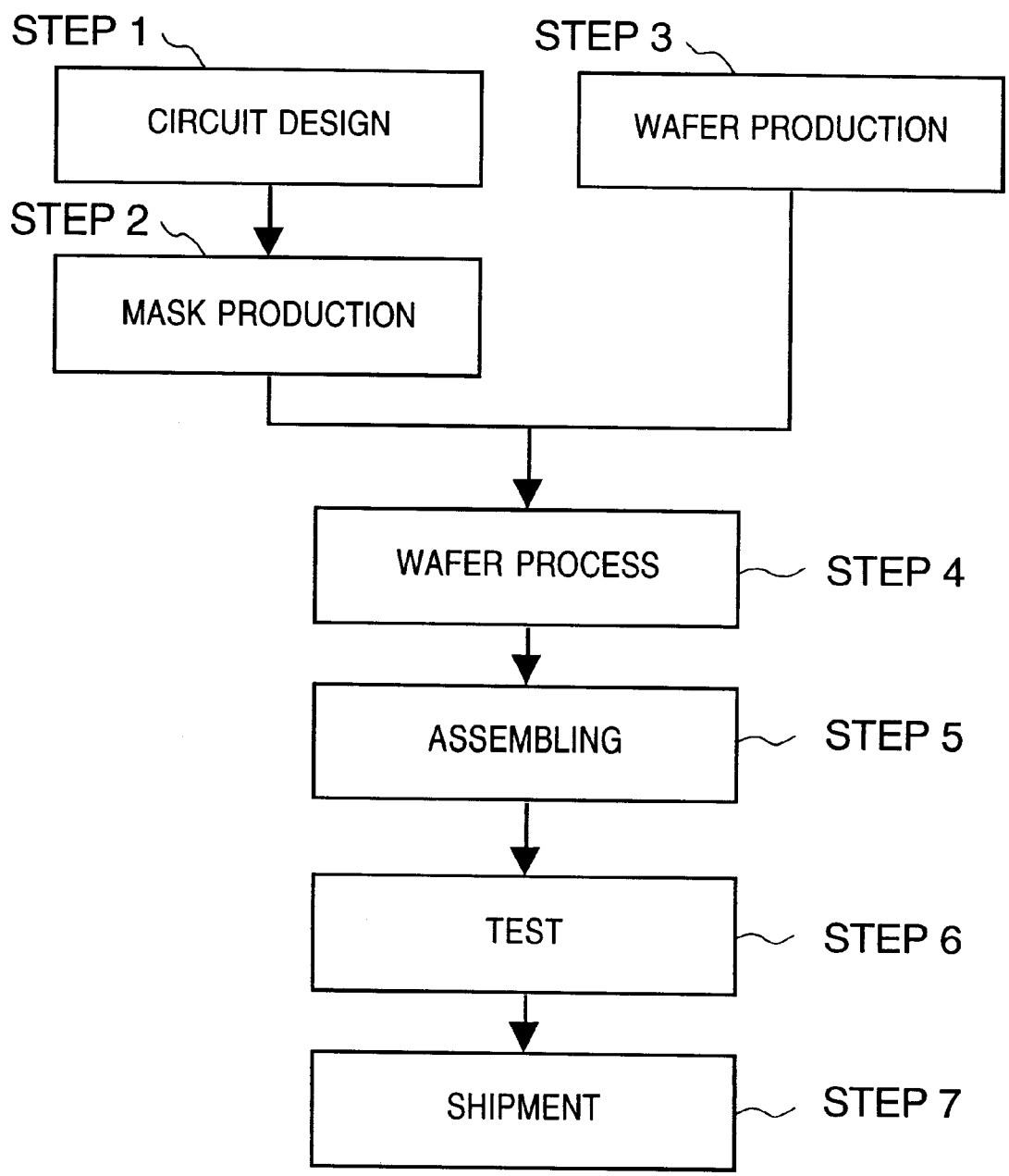
FIG. 10 is a flowchart illustrating a process of producing a semiconductor or device.

A method of producing a device using the projection exposure apparatus is described below. FIG. 10 is a flowchart illustrating a process of producing a micro device (e.g., a semiconductor chip such as an IC or LSI, a liquid crystal panel, a CCD, a thin-film magnetic head, a micro machine). In step 1 (circuit design), a circuit pattern of a device is designed. In step 2 (reticle production), reticles having circuit patterns designed in step 1 are produced. In step 3 (substrate production), a substrate is produced using a material such as silicon or glass. In step 4 (substrate process or often called a first half process), an actual circuit is formed on the substrate by means of a lithography technique using the reticles and the substrate produced in the previous steps. In step 5 (assembly process or often called a second half process), the substrate on which circuits were formed in step 4 are divided into chips. This step includes the sub steps of assembly (dicing and bonding) and packaging (chip encapsulation). In step 6 (test), the semiconductor devices produced in the previous steps are tested to check whether they operate correctly. The reliability of the devices are also evaluated in this step. The semiconductor devices which have been completed through these steps are shipped in step 7.

Figure 11:
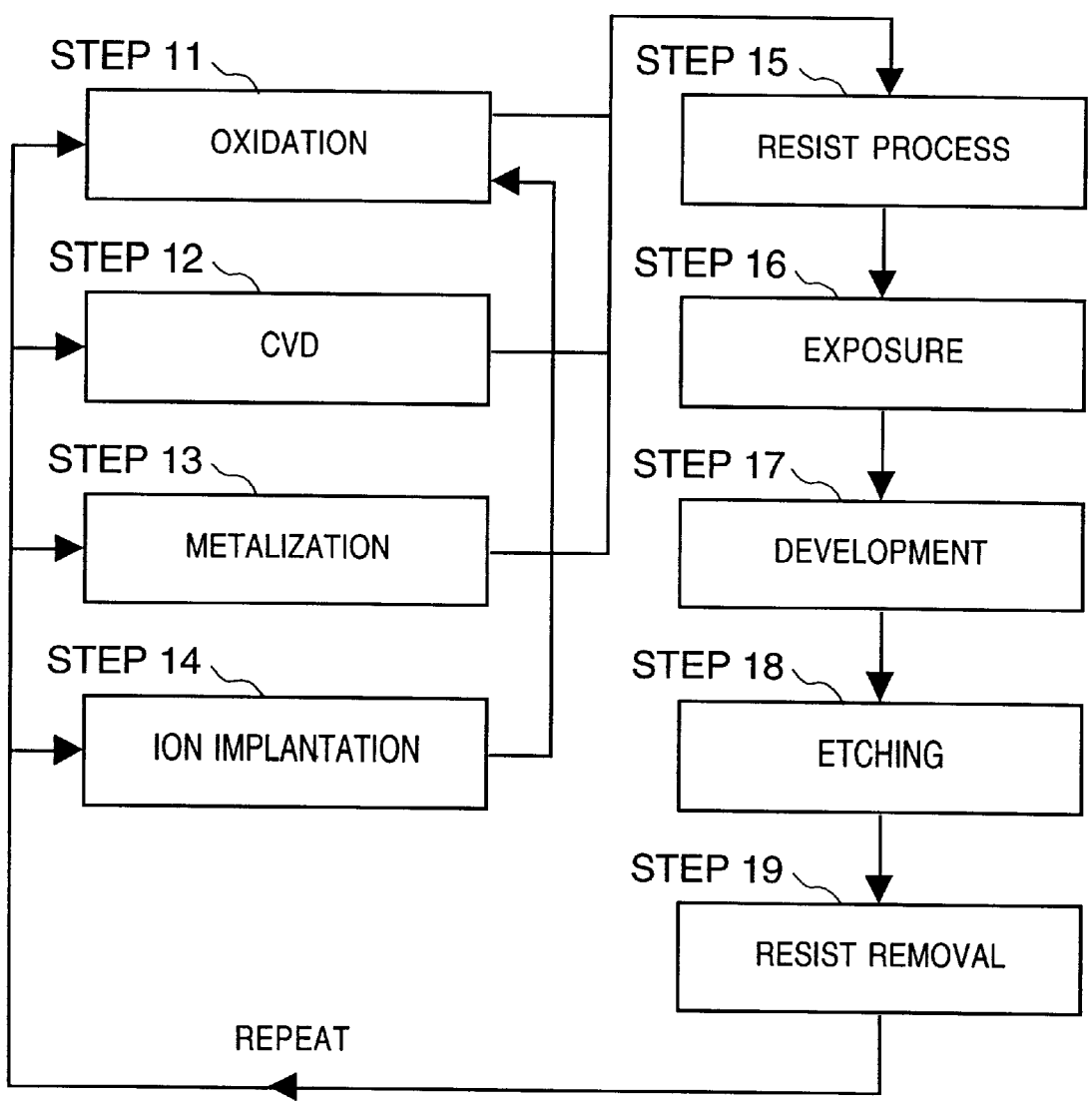
FIG. 11 is a detailed flowchart of a wafer process.

FIG. 11 is a detailed flowchart of the substrate process. In step 11 (oxidation), the surface of the substrate is oxidized. In step 12 (CVD), an insulating film is formed on the surface of the substrate. In step 13 (metalization), electrodes are formed on the surface of the substrate by means of evaporation. In step 14 (ion implantation), ions are implanted into the substrate. In step 15 (resist process), a resist is coated on the substrate. In step 16 (exposure), the circuit pattern formed on the reticle is projected onto the substrate using any of the exposure apparatus described above so that a plurality of shot areas are exposed to the circuit pattern. After the exposure process, the substrate is developed in step 17 (development). In step 18 (etching), the surface of the substrate is partially removed except the portions covered by the resist pattern developed in the previous step. In step 19 (resist removal), the resist which has become no longer necessary after completion of the etching process is removed. The above process is performed repeatedly thereby forming a multilevel circuit pattern on the substrate. Thus, in accordance with the production method of the present embodiment, it is possible to produce, at low cost, a high-precision semiconductor device which cannot be achieved by the conventional techniques.

The present invention is not limited to the above embodiments and various changes and modifications can be made within the spirit and scope of the present invention. Therefore, to appraise the public of the scope of the present invention, the following claims are made.

What is claimed is:

1. A projection exposure apparatus capable of detecting projection exposure conditions in the middle of a laser beam irradiation path, said projection exposure apparatus comprising:

a laser source for generating a laser beam;

an illumination optical unit for illuminating a reticle with said laser beam;

a projection optical unit for projecting a pattern of said reticle onto a wafer;

a light shielding member in which the path of the laser beam emitted by said laser source is enclosed and in which an inert gas is supplied;

a removable enclosure for enclosing said light shielding member;

an insertion slot formed in said light shielding member so that a detector for detecting a physical or chemical characteristic in the vicinity of the laser beam path may be inserted into said insertion slot;

a light shielding lid provided on said light shielding member, said light shielding lid being capable of being opened and closed when the detector is inserted or removed, wherein when the detector is inserted, said light shielding lid is pushed into its open position, whereas when the detector is removed, said light shielding lid moves into a closed position and rests in said closed position in which the insertion slot is closed with said light shielding lid; and an interlock mechanism for detecting at least one of the presence and removal of said enclosure and for causing a laser beam to be generated by said laser source in accordance with a result of the detection.

2. A projection exposure apparatus according to claim 1, wherein when the detector is inserted, said light shielding lid is opened to the inner side of said light shielding member, whereas when the detector is removed, said light shielding lid returns by means of its own weight into the closed position and rests in said closed position in which said insertion slot is closed with said light shielding lid.

3. A projection exposure apparatus according to claim 1, wherein said light shielding lid includes a mechanism whereby when the detector is inserted, said light shielding lid is opened to the inner side of said light shielding member, whereas when the detector is removed, said light shielding lid is moved by means of a spring force into the closed position and rests in said closed position in which said insertion slot is closed with said light shielding lid.

4. A projection exposure apparatus according to claim 1, further comprising a tight sealing lid provided on said light shielding member and a sealing member in the form of an O-ring disposed between said tight sealing lid and said light shielding member whereby the sealing tightness is enhanced.

5. A projection exposure apparatus according to claim 1, wherein said physical characteristic is the intensity of the laser beam and said chemical characteristic is the concentration of the inert gas.

6. A projection exposure apparatus capable of detecting projection exposure conditions in the middle of a laser beam irradiation path, said projection exposure apparatus comprising:

a laser source for generating a laser beam;

an illumination optical unit for illuminating a reticle with said laser beam;

a projection optical unit for projecting a pattern of said reticle onto a wafer;

a light shielding member in which the path of the laser beam emitted by said laser source is enclosed and in which an inert gas is supplied;

a removable enclosure for enclosing said light shielding member;

an insertion slot formed in said light shielding member so that a detector for detecting a physical or chemical characteristic in the vicinity of the laser beam path may be inserted into said insertion slot;

a tight sealing lid provided on said light shielding member, said tight sealing lid being capable of being opened and closed when the detector is inserted or removed, wherein when the detector is inserted, said tight sealing lid comes into an open position in which said tight sealing lid prevents said enclosure from being placed in a normal position; and an interlock mechanism for detecting at least one of the presence and removal of said enclosure and for causing a laser beam to be generated by said laser source in accordance with a result of the detection.

7. A projection exposure apparatus according to claim 6, further comprising a light shielding lid provided on said light shielding member, said light shielding lid being capable of being opened and closed when the detector is inserted or removed, wherein when the detector is inserted, said light shielding lid is pushed into its open position, whereas when the detector is removed, said light shielding lid moves into a closed position and rests in said closed position in which the insertion slot is closed with said light shielding lid.

8. A projection exposure apparatus according to claim 6, wherein said tight sealing lid includes a rotation shaft extending in a direction substantially perpendicular to the direction in which the detector is inserted, and said tight sealing lid further includes a mechanism whereby said tight sealing lid moves by means of its own weight to the outside of said light shielding member and rests in that position.

9. A projection exposure apparatus according to claim 6, wherein said tight sealing lid includes a mechanism whereby said tight sealing lid moves into a horizontal position by means of its own weight in a plane substantially perpendicular to the direction in which the detector is inserted and rests in an open position.

10. A projection exposure apparatus according to claim 6, wherein said tight sealing lid further includes a mechanism whereby said tight sealing lid moves by means of a spring force into an open position and rests in that position.

11. A projection exposure apparatus according to claim 6, further comprising a sealing member disposed between said tight sealing lid and said light shielding member whereby the sealing tightness is enhanced.

12. A projection exposure apparatus according to claim 6, wherein said physical characteristic is the intensity of the laser beam and said chemical characteristic is the concentration of the inert gas.

13. A projection exposure apparatus capable of detecting projection exposure conditions in the middle of a laser beam irradiation path, said projection exposure apparatus comprising:

a laser source for generating a laser beam;
an illumination optical unit for illuminating a reticle with said laser beam;
a projection optical unit for projecting a pattern of said reticle onto a wafer;
a light shielding member in which the path of the laser beam emitted by said laser source is enclosed and in which an inert gas is supplied;
a removable enclosure for enclosing said light shielding member;
an insertion slot formed in said light shielding member so that a detector for detecting a physical or chemical characteristic in the vicinity of the laser beam path may be inserted into said insertion slot;
a lid disposed on said insertion slot and capable of being opened and closed when the detector is attached or removed; and
an interlock mechanism for detecting at least one of the presence and removal of said enclosure and for causing a laser beam to be generated by said laser source in accordance with a result of the detection.

14. A projection exposure apparatus according to claim 13, wherein said physical characteristic is the intensity of the laser beam and said chemical characteristic is the concentration of the inert gas.

15. A method of producing a semiconductor device, comprising:

generating a laser beam with a laser source;
illuminating, with an illumination optical unit, a reticle with the laser beam;
projecting, with a projection optical unit, a pattern of the reticle onto a wafer to produce a semiconductor device;
providing a light shielding member in which the path of the laser beam emitted by the laser source is enclosed and in which an inert gas is supplied;
enclosing, with a removable enclosure, the light shielding member;
providing an insertion slot in the light shielding member so that a detector for detecting a physical or chemical characteristic in the vicinity of the laser beam path may be inserted into the insertion slot;
providing a light shielding lid on the light shielding member, the light shielding lid being capable of being opened and closed when the detector is inserted or removed, wherein when the detector is inserted, the light shielding lid is pushed into its open position, whereas when the detector is removed, the light shielding lid moves into a closed position and rests in the closed position in which the insertion slot is closed with the light shielding lid;
detecting, with an interlock mechanism, at least one of the presence and removal of the enclosure; and
causing a laser beam to be generated by the laser source in accordance with a result of the detection in said detecting step.

16. A method of producing a semiconductor device, comprising:

generating a laser beam with a laser source;
illuminating, with an illumination optical unit, a reticle with the laser beam;
projecting, with a projection optical unit, a pattern of the reticle onto a wafer to produce a semiconductor device;
providing a light shielding member in which the path of the laser beam emitted by the laser source is enclosed and in which an inert gas is supplied;
enclosing, with a removable enclosure, the light shielding member;
providing an insertion slot in the light shielding member so that a detector for detecting a physical or chemical characteristic in the vicinity of the laser beam path may be inserted into the insertion slot;
providing a tight sealing lid on the light shielding member, the tight sealing lid being capable of being opened and closed when the detector is inserted or removed, wherein when the detector is inserted, the tight sealing lid comes into an open position in which the tight sealing lid prevents the enclosure from being placed in a normal positions;
detecting, with an interlock mechanism, at least one of the presence and removal of the enclosure; and
causing a laser beam to be generated by the laser source in accordance with a result of the detection in said detecting step.

17. A method of producing a semiconductor device, comprising:

generating a laser beam with a laser source;

illuminating, with an illumination optical unit, a reticle with the laser beam;

projecting, with a projection optical unit, a pattern of the reticle onto a wafer;

providing a light shielding member in which the path of the laser beam emitted by the laser source is enclosed and in which an inert gas is supplied;

providing a removable enclosure for enclosing the light shielding member;

providing an insertion slot in the light shielding member so that a detector for detecting a physical or chemical characteristic in the vicinity of the laser beam path may be inserted into the insertion slot;

disposing a lid on the insertion slot, the lid being capable of being opened and closed when the detector is attached or removed;

detecting, with an interlock mechanism, at least one of the presence and removal of the enclosure; and causing a laser beam to be generated by the laser source in accordance with a result of the detection in said detecting step.

18. A projection exposure apparatus capable of detecting projection exposure conditions in the middle of a laser beam irradiation path, said projection exposure apparatus comprising:

a laser source for generating a laser beam;

an illumination optical unit for illuminating a reticle with the laser beam;

a projection optical unit for projecting a pattern of the reticle onto a wafer;

a light shielding member in which the path of the laser beam emitted by said laser source is enclosed and in which an inert gas is supplied;

a removable enclosure for enclosing said light shielding member;

an insertion slot formed in said light shielding member so that a detector for detecting a physical or chemical characteristic in the vicinity of the laser beam path may be inserted into said insertion slot;

a tight sealing lid on said light shielding member to seal said insertion slot, said tight sealing lid preventing said enclosure from being attached when said tight sealing lid is attached; and an interlock mechanism for detecting at least one of the presence and removal of said enclosure, wherein said laser source generates a laser beam according to a result of the detection by said interlock mechanism.

19. A projection exposure apparatus according to claim 18, wherein said tight sealing lid is capable of being opened if said enclosure is removed.

20. A projection exposure apparatus according to claim 18, wherein said detector prevents said enclosure from being attached when said detector is inserted into said insertion slot.

21. A projection exposure apparatus according to claim 18, wherein said light shielding lid shades said insertion slot.

22. A projection exposure apparatus according to claim 21, wherein said light shielding lid is capable of being opened if said enclosure is removed.

23. A projection exposure apparatus according to claim 21, wherein said light shielding lid prevents said enclosure from being attached when said light shielding lid is attached.

24. A projection exposure apparatus according to claim 21, wherein said light shielding lid is pushed into its open position when said detector is inserted into said insertion slot.

25. A projection exposure apparatus according to claim 21, wherein said light shielding lid moves into its closed position when said detector is removed from said insertion slot.

26. An exposure apparatus, comprising:

a light shielding member in which a path of a laser beam is enclosed and in which an inert gas is supplied;

a removable enclosure for enclosing said light shielding member;

a tight sealing lid provided on said light shielding member, said tight sealing lid preventing said enclosure from being attached when said tight sealing lid is opened; and an interlock mechanism which detects at least one of the presence and removal of said enclosure and which causes a laser beam to be generated according to a result of the detection.

27. An exposure apparatus according to claim 26, further comprising an insertion slot formed in said light shielding member so that a detector for detecting a physical or chemical characteristic in the vicinity of the laser beam path may be inserted into said insertion slot.

28. An exposure apparatus according to claim 26, further comprising a tight sealing lid on said light shielding member to seal said insertion slot, wherein said tight sealing lid is capable of being opened if said enclosure is removed.

29. An exposure apparatus according to claim 26, wherein said detector prevents said enclosure from being attached when said detector is inserted into said insertion slot.

30. An exposure apparatus according to claim 26, further comprising a tight sealing lid provided on said light shielding member, said tight sealing lid being capable of being opened towards a path of the laser beam with an external force, and if the external force is removed, said tight sealing lid is closed by its own weight.

* * * * *

UNITED STATES PATENT AND TRADEMARK OFFICE
CERTIFICATE OF CORRECTION

PATENT NO. : 6,278,516 B1
DATED : August 21, 2001
INVENTOR(S) : Yoshinori Miwa et al.

It is certified that error appears in the above-identified patent and that said Letters Patent is hereby corrected as shown below:

Column 2,
Line 15, "position" should read -- position, --; and
Line 36, "removed" should read -- removed, --.

Column 3,
Line 13, "position" should read -- position, --;
Line 20, "member" should read -- member, --; and
Line 31, "member" should read -- member, --.

Column 4,
Line 32, "DRAWING" should read -- DRAWINGS --; and
Line 60, "or" should be deleted.

Column 6,
Line 5, "member 24" should read -- member 102 --; and
Line 61, "In" should read -- ¶ In --.

Column 9,
Line 11, "machine)." should read -- machine, etc.). --.

Column 12,
Line 61, "positions;" should read -- position; --.

Column 14,
Line 8, "light shielding lid shades" should read -- light shielding member has a light sealing lid to shade --.

Signed and Sealed this

Ninth Day of April, 2002

*Attest:*

*Attesting Officer*

JAMES E. ROGAN
*Director of the United States Patent and Trademark Office*